(12) United States Patent
Lee et al.

(10) Patent No.: US 10,084,444 B2
(45) Date of Patent: Sep. 25, 2018

(54) GATE-DRIVING APPARATUS FOR PROVIDING NEGATIVE VOLTAGE TO GATE OF SWITCH

(71) Applicant: Hyundai Motor Company, Seoul (KR)

(72) Inventors: Dae Woo Lee, Incheon (KR); Jin Myeong Yang, Busan (KR); In Yong Yeo, Bucheon-si (KR); Jin Young Yang, Hanam-si (KR); Youn Sik Lee, Suwon-si (KR); Byeong Seob Song, Yongin-si (KR); Woo Young Lee, Yongin-si (KR)

(73) Assignee: Hyundai Motor Company, Seoul (KR)

( * ) Notice: Subject to any disclaimer, the term of this patent is extended or adjusted under 35 U.S.C. 154(b) by 0 days.

(21) Appl. No.: 15/357,887

(22) Filed: Nov. 21, 2016

(65) Prior Publication Data

US 2018/0054195 A1    Feb. 22, 2018

(30) Foreign Application Priority Data

Aug. 17, 2016 (KR) .......................... 10-2016-0104320

(51) Int. Cl.
| | |
|---|---|
| *H03K 17/56* | (2006.01) |
| *H03K 17/567* | (2006.01) |
| *H01L 29/16* | (2006.01) |
| *H01L 29/739* | (2006.01) |
| *H01L 29/78* | (2006.01) |

(52) U.S. Cl.
CPC ....... *H03K 17/567* (2013.01); *H01L 29/1608* (2013.01); *H01L 29/7393* (2013.01); *H01L 29/78* (2013.01)

(58) Field of Classification Search
CPC .. H03K 17/567; H03K 17/162; H03K 17/164; H03K 17/166; H03K 17/223; H03K 17/302; H03K 17/56; H03K 17/602; H03K 17/687
USPC .......................... 327/108, 109, 110, 111, 112
See application file for complete search history.

(56) References Cited

U.S. PATENT DOCUMENTS 5,434,527 A * 7/1995 Antone ............ H03K 17/04123
327/190
6,496,047 B1 * 12/2002 Iskander .............. H03K 17/102
327/109

FOREIGN PATENT DOCUMENTS

| JP | 2004-194450 A | 7/2004 |
|---|---|---|
| JP | 2009-188746 A | 8/2009 |
| JP | 2011-087235 A | 4/2011 |
| JP | 2016-040995 A | 3/2016 |

* cited by examiner

*Primary Examiner* — John Poos
(74) *Attorney, Agent, or Firm* — Morgan, Lewis & Bockius LLP

(57) ABSTRACT

Disclosed herein is a gate-driving apparatus configured for stably providing a voltage having a negative value to a gate of a switch, including a SiC (silicon carbide)-based FET (Field Effect Transistor), which requires a negative voltage having a negative value to implement a stable OFF state. The gate-driving apparatus includes a negative-voltage application circuit including a Zener diode and a capacitor connected in parallel to the Zener diode, wherein the Zener diode may have a cathode connected to a secondary coil of a pulse transformer and an anode connected to the gate of the switch.

10 Claims, 3 Drawing Sheets

GATE-DRIVING APPARATUS FOR PROVIDING NEGATIVE VOLTAGE TO GATE OF SWITCH

CROSS REFERENCE TO RELATED APPLICATION

The present application claims priority to Korean Patent Application No. 10-2016-0104320, filed Aug. 17, 2016, the entire contents of which is incorporated herein for all purposes by this reference.

BACKGROUND OF THE INVENTION

Field of the Invention

The present invention relates to a gate-driving apparatus. More particularly, the present invention relates to a gate-driving apparatus configured for stably providing a voltage having a negative value to a gate of a switch, such as a SiC (silicon carbide)-based FET (Field Effect Transistor), which requires a negative voltage having a negative value in order to implement a stable OFF state.

Description of the Related Art

With the rise of environmental pollution problems throughout the world, active research has been focused on environment-friendly vehicles in which electric energy is converted into driving force by motors, rather than conventional engine-driven vehicles, which combust fossil fuels with the concomitant emission of large quantities of air pollutants.

An environment-friendly vehicle designed to generate driving force by use of a motor is provided with a power convertor apparatus, such as an inverter, for converting DC voltage into three-phase AC voltage to be supplied to the motor. In the power convertor apparatus, a power semiconductor element, such as an IGBT (Insulated Gate Bipolar Transistor) or a FET (Field Effect Transistor), is used.

Power semiconductor elements, such as IGBTs and FETs, are fabricated largely through silicon-based semiconductor processes. In recent years, however, SiC (Silicon Carbide) has attracted attention as a new semiconductor device material because it can guarantee stable operation at high voltages and temperatures.

SiC can maintain semiconductor properties even at high temperatures because its energy band gap is three times as wide as silicon's. Also, having a breakdown field 10 times higher than that of silicon, SiC can operate stably even at high voltages. Further, SiC is very advantageous in terms of cooling owing to its high thermal conductivity, which is about three times as large as silicon's.

However, since a SiC-based power semiconductor element has a low threshold voltage, a gate voltage having a negative value must be applied to the transistor in order to switch the transistor off. Hence, a gate-driving apparatus, for driving a SiC-based power semiconductor to output both positive and negative voltages in order to utilize the SiC-based power semiconductor, has been proposed.

Conventional gate-driving apparatuses for driving a SiC-based power semiconductor employ an expensive, isolated IC to produce both positive and negative voltages, and additionally require a small transformer for supplying an electric source to the isolated IC.

As such, a conventional gate-driving apparatus requires an isolated IC, and a transformer designed to supply an electric source to the IC, for the utilization of a SiC-based power semiconductor, resulting in an additional cost for the fabrication of a power convertor apparatus. In addition, the additional electric source makes it possible for electricity to remain in the isolated IC even when a signal for driving a gate is blocked, thereby causing the gate of the SiC-based power semiconductor to malfunction.

The information disclosed in this Background of the Invention section is only for enhancement of understanding of the general background of the invention and should not be taken as an acknowledgement or any form of suggestion that this information forms the prior art already known to a person skilled in the art.

SUMMARY OF THE INVENTION

Various aspects of the present invention are directed to providing a gate-driving apparatus configured for stably providing a voltage having a negative value to a gate of a switch, such as a SiC (silicon carbide)-based FET (Field Effect Transistor), which requires a negative voltage having a negative value to implement a stable OFF state.

To achieve the above object, according to one aspect of the present invention, there is provided a gate-driving apparatus for driving a gate of a switch, including a negative-voltage application circuit including a Zener diode and a capacitor connected in parallel to the Zener diode, wherein the Zener diode has a cathode connected to a secondary coil of a pulse transformer and an anode connected to the gate of the switch.

In one exemplary embodiment of the present invention, a pulse signal is provided to opposite terminals of the secondary coil, the gate-driving apparatus further including a path generation circuit configured for forming an electric path between the negative-voltage application circuit and the secondary coil when a positive (+) voltage of the pulse signal is applied to a terminal of the secondary coil to which the negative-voltage application circuit is connected, and for blocking an electric path between the negative-voltage application circuit and the secondary coil when a negative (−) voltage of the pulse signal is applied to a terminal of the secondary coil to which the negative-voltage application circuit is applied.

In another exemplary embodiment of the present invention, the path generation circuit has a structure in which, when a negative (−) voltage of the PWM pulse signal is applied to the secondary coil to which the negative-voltage application circuit is connected, an anode of the Zener diode is electrically connected to the gate of the switch while a cathode of the switch is connected to a drain or emitter of the switch.

In another exemplary embodiment of the present invention, the path generation circuit includes a switching element that is turned On/Off under a control of the voltage applied to a terminal of the secondary coil to which the negative-voltage application circuit is connected, and a diode that has an anode connected to a terminal of the secondary coil and a cathode connected to the cathode of the Zener diode, and wherein electrical connection or disconnection between the cathode of the diode and another terminal of the secondary coil is determined by an On/Off state of the switching element.

In another exemplary embodiment of the present invention, the pulse transformer includes a primary coil, designed to receive a PWM signal for operating the switch, and a plurality of secondary coils, for transforming and outputting a voltage of the primary coil, and the negative-voltage application circuit and the switch are plural in number so that a plurality of negative-voltage application circuits and a plurality of switches are respectively connected to the plurality of the secondary coils.

According to another aspect of the present invention, there is provided a gate-driving apparatus for driving a gate of a switch, including: a path generation circuit configured to change electric paths depending on the voltages of PWM pulses of the second coil, which alternate between positive (+) and negative (−) voltages; and a negative-voltage application circuit configured to be charged with a constant voltage by a first electric path formed by the path generation circuit and to apply a constant voltage charged by a second electric path formed by the path generation circuit as a negative voltage between a gate and a drain of the switch or between a gate and an emitter of the switch.

In one exemplary embodiment of the present invention, the negative-voltage application circuit includes a Zener diode and a capacitor connected in parallel to the Zener diode, wherein the Zener diode has a cathode connected to the path generation circuit and an anode connected to the gate of the switch.

In another exemplary embodiment of the present invention, the path generation circuit includes a switching element that is turned On/Off under a control of the voltage of the pulse signal, and wherein when the switching element is turned off, the first electric path is formed between the negative-voltage application circuit and the gate and input terminal of the switch, and when the switching element is turned on, both the negative-voltage application circuit and the gate of the switch are electrically disconnected from the input terminal while a second electric path is formed between the negative-voltage application circuit and the gate of the switch.

According to another aspect of the present invention, there is provided a gate-driving apparatus, including: a pulse transformer including a primary coil for receiving a PWM signal for driving a gate of a switch, and a secondary coil, electromagnetically connected with the primary coil, for voltage transformation and transmission of the PWM signal; a path generation circuit including a diode having an anode connected to one terminal of the secondary coil, and a switching element configured to make electric connection or disconnection between a cathode of the diode and another terminal of the secondary coil depending on the voltage of the PWM pulse signal; and a negative-voltage application circuit including a Zener diode having an anode connected to the cathode of the diode, and a capacitor connected in parallel to the Zener diode, wherein the gate of the switch is electrically connected to the cathode of the Zener diode, and a drain or emitter of the switch is connected to another terminal of the secondary coil.

In one exemplary embodiment of the present invention, the pulse transformer is provided with a plurality of the secondary coils, and the negative-voltage application circuit and the switch are plural in number so that a plurality of negative-voltage application circuits and a plurality of switches are respectively connected to the plurality of the secondary coils.

The methods and apparatuses of the present invention have other features and advantages which will be apparent from or are set forth in more detail in the accompanying drawings, which are incorporated herein, and the following Detailed Description, which together serve to explain certain principles of the present invention.

Figure 1:
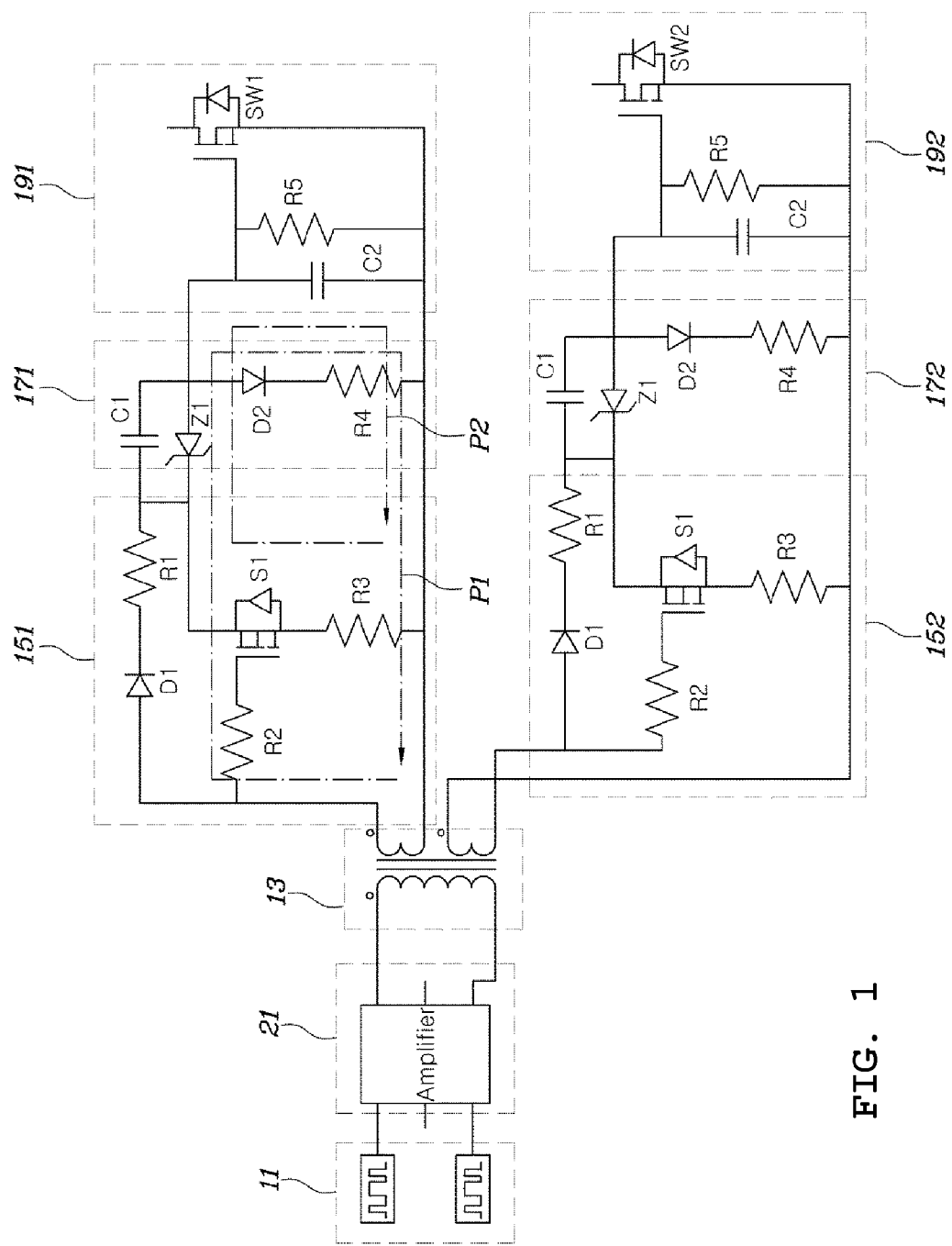
FIG. 1 is a circuit diagram for a gate-driving apparatus in accordance with an exemplary embodiment of the present invention.

It should be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION OF THE INVENTION

Reference will now be made in detail to various embodiments of the present invention(s), examples of which are illustrated in the accompanying drawings and described below. While the invention(s) will be described in conjunction with exemplary embodiments, it will be understood that the present description is not intended to limit the invention (s) to those exemplary embodiments. On the contrary, the invention(s) is/are intended to cover not only the exemplary embodiments, but also various alternatives, modifications, equivalents and other embodiments, which may be included within the spirit and scope of the invention as defined by the appended claims.

Hereinafter, exemplary embodiments of the present invention will be described in detail with reference to the accompanying drawings.

FIG. 1 is a circuit diagram for a gate-driving apparatus in accordance with an exemplary embodiment of the present invention.

With reference to FIG. 1, the gate-driving apparatus in accordance with an exemplary embodiment of the present invention may comprise a controller 11 for generating a small PWM signal to control the gate of switches SW1 and SW2, an amplifier 21 for amplifying the voltage of the PWM signal, a pulse transformer 13 for voltage transformation and transmission of the PWM signal amplified by the amplifier 21, and various circuit units 151, 152, 171, and 172 for generating gate driving signals to be applied to the gate of the switches SW1 and SW2, based on the signals transformed in the pulse transformer 12.

The controller 11 performs various determinations for operating the switches SW1 and SW2, and generates a PWM signal for driving the gate of the switches SW1 and SW2. For example, when the switches SW1 and SW2 are a power semiconductor element FET that is used in an inverter for providing power for a motor, the controller 11 determines the target current corresponding to the target torque of the motor and compares the target current with the current supplied to each phase of the inverter to generate a PWM signal for driving the gate of the switches SW1 and SW2, which have a duty ratio that allows for the output of current corresponding to the target current.

Here, the term "controller 11" is used as a concept encompassing at least one processor and at least one memory for storing results processed by the processor, but should not be construed to mean that one physical processor performs all the determinations and control described above.

The PWM signal generated by the controller 11 is small, and thus its voltage (amplitude) may be amplified by the amplifier 21. Since the amplifier 21 is provided at its rear end with the pulse transformer 13, acting as insulation between the switches SW1 and SW2 and the controller 11, the amplifier may be a non-isolated voltage amplifier available at low cost.

The pulse transformer 13 includes a primary coil, for inputting the amplified PWM signal from the amplifier 21, and a secondary coil, for transforming and outputting the voltage of the PWM signal input into the primary coil. That is, the primary coil forms an electromagnetically combined relationship with the secondary coil, and the PWM signal input into the primary coil is transmitted into the secondary coil after being transformed according to the turn ratio therebetween.

In various exemplary embodiments of the present invention, the secondary coil, electromagnetically combined with the primary coil to transform and output the voltage of the primary coil, may be plural in number. A plurality of secondary coils may be provided with respective circuits and switches SW1 and SW2.

In various exemplary embodiments of the present invention, a plurality of secondary coils may be provided, so that one PWM signal may be used to derive the gate of a plurality of switches SW1 and SW2.

In an exemplary embodiment of the present invention, a path generation circuit and a negative-voltage application circuit may be provided between a rear of the secondary coil of the pulse transformer 13 and each of the switches SW1 and SW2.

The path generation circuits 151 and 152 are configured to change electric paths depending on the voltages of PWM pulses of the second coil, which alternate between positive (+) and negative (−) voltages. For example, when the PWM pulse output from the secondary coil of the pulse transformer 13 may have a positive value, the secondary coil, the negative-voltage application circuits 171 and 172, and the gate terminals of the switches SW1 and SW2 are electrically connected to form one loop or mesh, thus generating an electric path P1. On the other hand, when the PWM pulse output from the secondary coil of the pulse transformer 13 may have a negative value, an electric loop is formed only between the negative-voltage application circuits 171 and 172 and the gate terminals of the switches SW1 and SW2 to generate an electric path P2.

In greater detail, the path generation circuits 151 and 152 may include a switching element S1, which is turned On/Off under the control of the voltage applied to a first end of the secondary coil of the pulse transformer 13, and a diode D1, which may have an anode connected to a first end of the secondary coil. As the switching element S1 is controllably turned On/Off, it can make an electrical connection or disconnection between the cathode of the diode D1 and a second end of the secondary coil.

In addition, the negative-voltage application circuits 171 and 172 may include a Zener diode Z1 and a capacitor connected in parallel to the Zener diode Z1. The Zener diode Z1 included in the negative-voltage application circuits 171 and 172 may have an anode connected to a first end of the secondary coil and a cathode connected to the gate terminal of the switches SW1 and SW2. In detail, the cathode of the Zener diode Z1 may be connected to the cathode of the diode D1 of the path generation circuits 151 and 152.

In the negative-voltage application circuits 171 and 172, a diode D2 and a resistor R4 may be additionally applied to the Zener diode Z1 and the capacitor C1. The diode D2 and the resistor R4 are configured to block reverse current and to control the magnitude of the current flowing into the switches SW1 and SW2, and may be omitted or connected with additional other electric elements if necessary.

The switches SW1 and SW2 may be power semiconductor elements that are turned On/Off in a controllable manner depending on the duty ratio of the PWM signal. The switches SW1 and SW2 may be SiC-based power semiconductor elements in which a voltage having a negative value must be applied to the gate upon an OFF state due to its low threshold voltage, but are not limited thereto. Assuming that the switches SW1 and SW2 are FETs, the application of voltage having a negative value between the gate terminal and the drain terminal may lead to an Off state. When the switches SW1 and SW2 are IGBT, they may be turned off by applying a voltage having a negative value between the gate terminal and the emitter terminal.

As shown in FIG. 1, the switching circuit unit may comprise a capacitor C2 and a resistor R5 between gate terminals and drain terminals of the switches SW1 and SW2. The capacitor C2 or the resistor R5 may be suitably employed, if necessary, to remove ripple currents or to adjust a size of ripple currents.

The operation of the gate-driving apparatus, structured as described above, in accordance with various exemplary embodiments of the present invention will be explained in detail in conjunction with the drawings.

Figure 2:
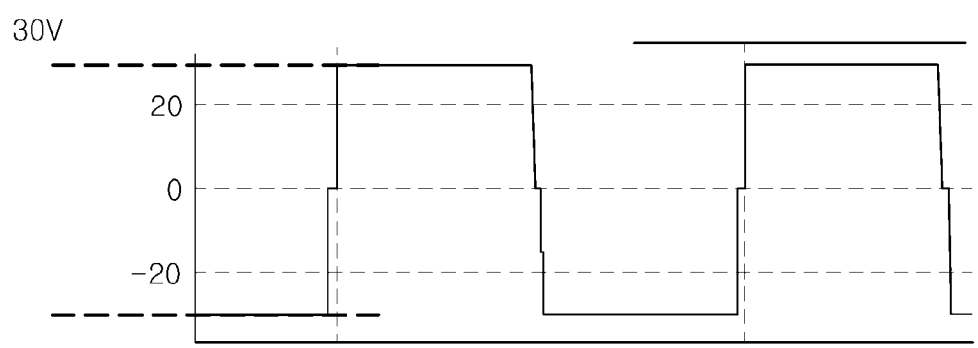
FIGS. 2 to 4 are waveform diagrams of voltages from each node of a gate-driving apparatus in accordance with an exemplary embodiment of the present invention.
Figure 3:
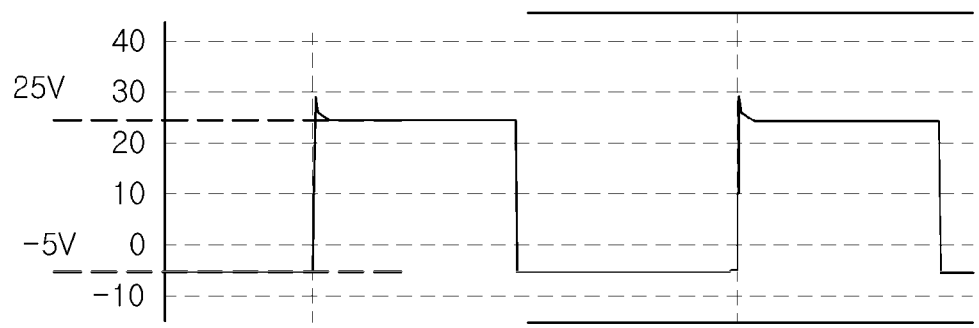
Figure 4:
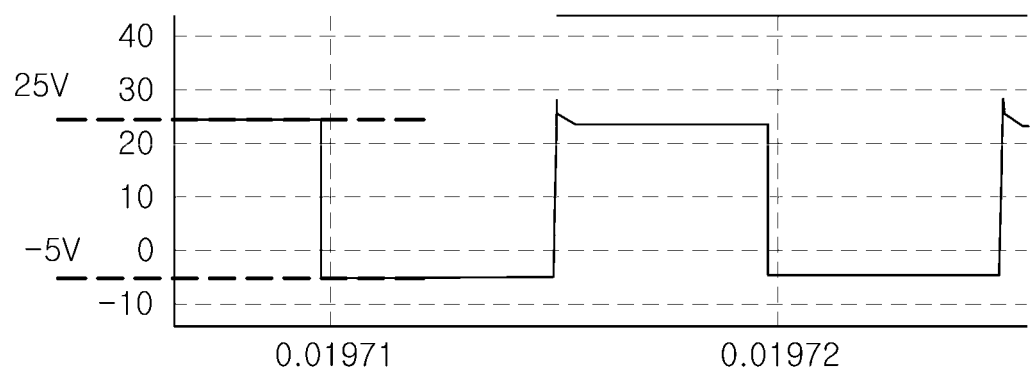

FIGS. 2 to 4 are waveform diagrams of voltages from each node of a gate-driving apparatus in accordance with an exemplary embodiment of the present invention.

First, FIG. 2 shows waveforms of the amplified PWM signal from the amplifier 21. As can be seen, the small PWM signal from the controller 11 is amplified into a signal having a voltage amplitude ranging from −30 V to 30 V. The amplitude of the amplified PWM signal is suitably transformed by the pulse transformer 13. The degree of transformation depends on the turn ratio between the primary coil and the secondary coil of the pulse transformer 13.

The application of a voltage having a positive value to one terminal of the secondary coil induces the application of a voltage having a positive value to the gate terminal of the switching element S1, turning the switching element S1 off. In this regard, the switching element S1 may be a p-type MOSFET. When the switching element S1 is turned off, an electric path P1 passing through the secondary coil, the diode D1, the negative-voltage application circuits 171 and 172, and the gate terminal of the switches SW1 and SW2 is formed.

The capacitor C1 of each of the negative-voltage application circuits 171 and 172 is charged by the current flowing through the path P1. The Zener diode Z1 has a predetermined breakdown voltage so that a constant voltage corresponding to the breakdown voltage is formed across the diode. That is, the second coil node of each of the negative-voltage application circuits 171 and 172 maintains a voltage higher, by an amount corresponding to the breakdown voltage, than that applied to the switch gate terminal of each of the negative-voltage application circuits 171 and 172.

In addition, since the voltage applied to one terminal of the secondary coil is larger than the breakdown voltage of the Zener diode Z1, a positive voltage is applied between the gate and the drain (or emitter) of each of the switches SW1 and SW2 by the electric path P1, turning the switches SW1 and SW2 on.

FIG. 3 shows waveforms of the gate driving signal applied to the gate of the switch SW1 shown in FIG. 1. As can be seen, the gate driving signal has a same phase as the PWM signal. In FIG. 3, a PWM pulse having a positive value is applied to the cathode of a Zener diode Z1 of the negative-voltage application circuit 171 in the ranges corresponding to 25 V, as described above.

FIG. 4 shows waveforms of the gate driving signal applied to the gate of the switch SW2 shown in FIG. 1. As shown in FIG. 1, the path generation circuit 152, for applying a gate driving signal to the switch SW2, and the negative-voltage application circuit 172 are connected to the secondary coil, with opposite polarity to that of the circuit for applying a gate driving signal to the switch SW1. Hence, the path generation circuit 152 and the negative-voltage application circuit 172, which are both applied to the switch SW2, perform a same operation as those applied to the switch SW1, but the gate driving signal applied to the switch SW2 is reverse in phase to that applied to the switch SW1.

The application of a voltage having a negative value to one terminal of the secondary coil leads to the application of a voltage having a negative value to the gate terminal of the switching element S1, turning the switching element S1 on. When the switching element S1 is turned on, the cathode of the diode D1 is electrically connected to a second terminal of the secondary coil through the switching element S1. Thus, the gate of the switches SW1 and SW2 is not electrically connected to an electric path including the second coil, resulting in the formation of an electric path passing through the negative-voltage application circuits 171 and 172, the gate terminal of the switches SW1 and SW2, and the switching element S1.

When the electric path P2 is formed, the constant voltage, charged in the capacitor, corresponding to the breakdown voltage of the Zener diode Z1, is applied to the gate of the switches SW1 and SW2. Because a higher voltage than the constant voltage charged in the capacitor C1 is present at the node of the cathode of the Zener diode Z1, a voltage having a negative value, corresponding to the breakdown voltage of the Zener diode Z1, is applied between the gate and the drain (or emitter) of each of the switches SW1 and SW2, turning the switches SW1 and SW2 off.

Requiring no additional ICs for applying a voltage having a negative value to the gate of a power semiconductor element, as described above, the gate-driving apparatus according to embodiments of the present invention can be made smaller and at lower cost than conventional apparatuses.

In addition, the absence of additional ICs in the gate-driving apparatus according to embodiments of the present invention removes the necessity of a power source for the additional ICs and thus solves the gate malfunction caused by the power source. Also, damage to switches by fire is prevented, with the consequent prevention of system errors.

The foregoing descriptions of specific exemplary embodiments of the present invention have been presented for purposes of illustration and description. They are not intended to be exhaustive or to limit the invention to the precise forms disclosed, and obviously many modifications and variations are possible in light of the above teachings. The exemplary embodiments were chosen and described in order to explain certain principles of the invention and their practical application, to thereby enable others skilled in the art to make and utilize various exemplary embodiments of the present invention, as well as various alternatives and modifications thereof. It is intended that the scope of the invention be defined by the Claims appended hereto and their equivalents.

What is claimed is:

1. A gate-driving apparatus for driving a gate of a switch, comprising a negative-voltage application circuit including a Zener diode and a capacitor connected in parallel to the Zener diode, wherein the Zener diode has a cathode connected to a secondary coil of a pulse transformer and an anode connected to the gate of the switch,
    wherein the capacitor is charged by a breakdown voltage of the Zener diode, and
    wherein the charged voltage of the capacitor is applied between the gate and a drain of the switch or between the gate and an emitter of the switch so that a voltage of the drain or the emitter is to be higher than a voltage of the gate.

2. The gate-driving apparatus of claim 1, wherein a pulse signal is provided to opposite terminals of the secondary coil, the gate-driving apparatus further including a path generation circuit configured for forming an electric path between the negative-voltage application circuit and the secondary coil when a positive (+) voltage of the pulse signal is applied to a terminal of the secondary coil to which the negative-voltage application circuit is connected, and for blocking an electric path between the negative-voltage application circuit and the secondary coil when a negative (−) voltage of the pulse signal is applied to a terminal of the secondary coil to which the negative-voltage application circuit is applied.

3. The gate-driving apparatus of claim 2, wherein the path generation circuit has a structure in which, when a negative (−) voltage of a PWM pulse signal is applied to the secondary coil to which the negative-voltage application circuit is connected, the anode of the Zener diode is electrically connected to the gate of the switch while a cathode of the switch is connected to the drain or the emitter of the switch.

4. The gate-driving apparatus of claim 2, wherein the path generation circuit includes a switching element that is configured to be turned On/Off under a control of the voltage applied to a terminal of the secondary coil to which the negative-voltage application circuit is connected, and a diode that has an anode connected to a terminal of the secondary coil and a cathode connected to the cathode of the Zener diode, and wherein electrical connection or disconnection between the cathode of the diode and another terminal of the secondary coil is determined by an On/Off state of the switching element.

5. The gate-driving apparatus of claim 1, wherein the pulse transformer includes a primary coil, designed to receive a PWM signal for operating the switch, and a plurality of secondary coils, for transforming and outputting a voltage of the primary coil, and the negative-voltage application circuit and the switch are plural in number so that a plurality of negative-voltage application circuits and a plurality of switches are respectively connected to the plurality of the secondary coils.

6. A gate-driving apparatus for driving a gate of a switch, comprising:
    a path generation circuit configured to change electric paths depending on a voltages of PWM pulses of a second coil, which alternate between positive (+) and negative (−) voltages; and
    a negative-voltage application circuit configured to be charged with a constant voltage by a first electric path formed by the path generation circuit and to apply a constant voltage charged by a second electric path formed by the path generation circuit as a negative voltage, wherein the negative voltage is a voltage applied between the gate and a drain of the switch or between the gate and an emitter of the switch so that a voltage of the drain or the emitter is to be higher than a voltage of the gate.

7. The gate-driving apparatus of claim 6, wherein the negative-voltage application circuit includes a Zener diode and a capacitor connected in parallel to the Zener diode, wherein the Zener diode has a cathode connected to the path generation circuit and an anode connected to the gate of the switch.

8. The gate-driving apparatus of claim 7, wherein the path generation circuit includes a switching element that is configured to be turned On/Off under a control of the voltage of a pulse signal, and wherein when the switching element is turned off, the first electric path is formed between the negative-voltage application circuit and the gate and an input terminal of the switch, and when the switching element is turned on, both the negative-voltage application circuit and the gate of the switch are electrically disconnected from the input terminal while a second electric path is formed between the negative-voltage application circuit and the gate of the switch.

9. A gate-driving apparatus, comprising:
a pulse transformer comprising
a primary coil for receiving a PWM signal for driving a gate of a switch, and
a secondary coil, electromagnetically connected with the primary coil, for voltage transformation and transmission of the PWM signal;

a path generation circuit comprising
a diode having an anode connected to one terminal of the secondary coil, and
a switching element configured to make electric connection or disconnection between a cathode of the diode and another terminal of the secondary coil depending on a voltage of the PWM pulse signal; and a negative-voltage application circuit including
a Zener diode having an anode connected to the cathode of the diode, and
a capacitor connected in parallel to the Zener diode,
wherein the gate of the switch is electrically connected to the cathode of the Zener diode, and a drain or an emitter of the switch is connected to another terminal of the secondary coil,
wherein the capacitor is charged by a breakdown voltage of the Zener diode, and
wherein the charged voltage of the capacitor is applied between the gate and the drain of the switch or between the gate and the emitter of the switch so that a voltage of the drain or the emitter is to be higher than a voltage of the gate.

10. The gate-driving apparatus of claim 1, wherein the pulse transformer is provided with a plurality of the secondary coils, and the negative-voltage application circuit and the switch are plural in number so that a plurality of negative-voltage application circuits and a plurality of switches are respectively connected to the plurality of the secondary coils.

* * * * *